(12) United States Patent
Park et al.

(10) Patent No.: US 11,887,402 B2
(45) Date of Patent: Jan. 30, 2024

(54) FINGERPRINT SENSOR AND DISPLAY DEVICE INCLUDING THE SAME

(71) Applicant: SAMSUNG DISPLAY CO., LTD., Yongin-si (KR)

(72) Inventors: Young Ok Park, Seoul (KR); Jun Woo You, Seongnam-si (KR); Byung Hoon Kim, Hwaseong-si (KR); June Hyoung Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/152,979

(22) Filed: Jan. 20, 2021

(65) Prior Publication Data

US 2021/0350100 A1 Nov. 11, 2021

(30) Foreign Application Priority Data

May 11, 2020 (KR) ......................... 10-2020-0055686

(51) Int. Cl.
*G06V 40/13* (2022.01)
*H10K 59/40* (2023.01)

(52) U.S. Cl.
CPC ......... *G06V 40/1318* (2022.01); *H10K 59/40* (2023.02)

(58) Field of Classification Search
None
See application file for complete search history.

(56) References Cited

U.S. PATENT DOCUMENTS

| 5,726,443 | A * | 3/1998 | Immega | G06V 40/1312 |
| | | | | 250/221 |
| 6,340,248 | B1 | 1/2002 | Naor | |
| 2007/0109438 | A1* | 5/2007 | Duparre | G02B 3/0056 |
| | | | | 348/335 |
| 2017/0220844 | A1* | 8/2017 | Jones | G06V 40/13 |
| 2017/0286743 | A1* | 10/2017 | Lee | G06V 40/1318 |
| 2018/0089491 | A1* | 3/2018 | Kim | G02B 6/0088 |
| 2018/0299982 | A1* | 10/2018 | Liu | G06F 3/0412 |
| 2018/0356915 | A1* | 12/2018 | Yeke Yazdandoost | |
| | | | | G06F 3/042 |
| 2018/0366593 | A1* | 12/2018 | Huang | H01L 27/14623 |
| 2019/0197290 | A1* | 6/2019 | Chen | G06V 40/1359 |

(Continued)

FOREIGN PATENT DOCUMENTS

WO 2017211152 12/2017

OTHER PUBLICATIONS

Nesterenko et al., "Design and Analysis of Tapered Waveguides as Collimators for LED Backlighting", SID 05 Digest, 2005, pp. 1388-1391.

(Continued)

*Primary Examiner* — Benjamin X Casarez
(74) *Attorney, Agent, or Firm* — F. CHAU & ASSOCIATES, LLC

(57) ABSTRACT

A fingerprint sensor includes: a light sensing layer including a light sensing element, wherein a sensing current flows in the light sensing element according to incident light; and a collimator layer disposed on the light sensing layer and including a light guide unit guiding light to the light sensing element. The light guide unit includes: a light-transmitting unit configured to provide light to the light sensing element; and a first light-blocking unit disposed on an inner surface of the light-transmitting unit.

18 Claims, 12 Drawing Sheets

(56) References Cited

U.S. PATENT DOCUMENTS

| | | | |
|---|---|---|---|
| 2020/0106979 A1* | 4/2020 | Liu | H04N 5/3696 |
| 2020/0234026 A1* | 7/2020 | Du | G06V 40/1312 |
| 2020/0359915 A1* | 11/2020 | Kobayashi | A61B 5/026 |
| 2021/0225915 A1* | 7/2021 | Huang | H01L 27/14625 |
| 2021/0333441 A1* | 10/2021 | Schwartz | G02B 27/30 |
| 2022/0058365 A1* | 2/2022 | Tomioka | H01L 27/14685 |
| 2022/0358782 A1* | 11/2022 | Wang | G06F 3/0443 |

OTHER PUBLICATIONS

De Stefano et al., "Lensless light focusing with the centric marine diatom Coscinodiscus walesii", Dec. 24, 2007, vol. 15, No. 26 / Optics Express, pp. 18082-18088.

Fu et al., "Subwavelength focusing of light by a tapered microtube", Appl. Phys. Lett. 97, 2010, pp. 041114-1-041114-3.

\* cited by examiner

FINGERPRINT SENSOR AND DISPLAY DEVICE INCLUDING THE SAME

CROSS-REFERENCE TO RELATED APPLICATION

This application claims priority under 35 U.S.C. § 119 to Korean Patent Application No. 10-2020-0055686 filed on May 11, 2020, the disclosure of which is incorporated by reference herein in its entirety.

TECHNICAL FIELD

The present inventive concept relates to a fingerprint sensor and a display device including the same.

DISCUSSION OF THE RELATED ART

Display devices are employed in a variety of electronic devices such as a smart phone, a tablet personal computer (PC), a laptop computer, a monitor and a television. Recently, as the mobile communications technology evolves, portable electronic devices such as smartphones, tablet PCs and laptop computers are becoming more common. A portable electronic device may store private information such as contact numbers, records of calls, messages, pictures, memos, user's web surfing information, location information, and financial information. Therefore, to protect private information stored in portable electronic devices, fingerprint authentication has been used to verify a fingerprint, which is a user's biometric information. To do so, a display device ma include a fingerprint sensor for fingerprint authentication.

The fingerprint sensor may be implemented by using, for example, an optical scanner, an ultrasonic scanner, or a capacitive scanner. An optical fingerprint sensor may include, for example, a collimator having an optical sensing unit for sensing light, an opening providing light to the optical sensing unit, and a light-blocking unit for blocking light. In such a case, the thickness of the fingerprint sensor may be increased by the height of the collimator.

SUMMARY

According to an exemplary embodiment of the present inventive concept, a fingerprint sensor includes: a light sensing layer including a light sensing element, wherein a sensing current flows in the light sensing element according to incident light; and a collimator layer disposed on the light sensing layer and including a light guide unit guiding light to the light sensing element. The light guide unit includes: a light-transmitting unit configured to provide light to the light sensing element and a first light-blocking unit disposed on an inner surface of the light-transmitting unit.

In an exemplary embodiment of the present inventive concept, the collimator layer further includes a second light-blocking unit surrounding an outer surface of the light-transmitting unit.

In an exemplary embodiment of the present inventive concept, a refractive index of the first light-blocking unit is smaller than a refractive index of the light-transmitting unit, and a refractive index of the second light-blocking unit is smaller than the refractive index of the light-transmitting unit.

In an exemplary embodiment of the present inventive concept, the inner surface of the light-transmitting unit is inclined at a first angle with respect to an upper surface of the light sensing layer, wherein the outer surface of the light-transmitting unit is inclined at a second angle with respect to the upper surface of the light sensing layer, wherein the first angle is substantially equal to the second angle.

In an exemplary embodiment of the present inventive concept, the inner surface of the light-transmitting unit is inclined at first angle with respect to an upper surface of the light sensing layer, wherein the outer surface of the light-transmitting unit is inclined at a second angle with respect to the upper surface of the light sensing layer, wherein first angle is different from the second angle.

In an exemplary embodiment of the present inventive concept, each of the light guide unit and the first light-blocking unit has a cone shape.

In an exemplary embodiment of the present inventive concept, an upper surface of the light-transmitting unit has an annular shape from a plan view, and wherein an upper surface of the first light-blocking unit has a circular shape from a plan view.

$a^2/\lambda \times z \ll 1$ exemplary embodiment of the present inventive concept, $a^2/\lambda \times z \ll 1$ is satisfied, wherein "a" denotes a diameter of an upper surface of the light guide writ, "z" denotes a height of the light guide unit, and "$\lambda$" denotes a wavelength of light incident on the light-transmitting unit.

In an exemplary embodiment of the present inventive concept, a width of the light-transmitting unit ranges from about 0.8 μm to about 2 μm.

In an exemplary embodiment of the present inventive concept, as area of an upper surface of the light guide unit is larger than an area of an upper surface of the first light-blocking unit.

In an exemplary embodiment of the present inventive concept, a cross-sectional area of the first light-blocking unit decreases toward the light sensing layer.

In an exemplary embodiment of the present inventive concept, the light guide unit has a truncated cone shape, a truncated polypyramid shape, or a truncated polygonal cone shape.

In an exemplary embodiment of the present inventive concept, an area of an upper surface of the light guide unit is larger than an area of a lower surface of the light guide unit.

In an exemplary embodiment of the present inventive concept, each of the light guide unit and the first light-blocking unit has a polypyramid shape.

In an exemplary embodiment of the present inventive concept, the light-transmitting unit has a polygonal shape with an opening from a plan view, and wherein the first light-blocking unit has a polygonal shape from a plan view.

According to an exemplary embodiment of the present inventive concept, a display device includes: a display panel configured to display an image; and a fingerprint sensor disposed, on a surface of the display panel and configured to sense light passing through the display panel. The fingerprint sensor includes: a light sensing layer including a light sensing element, wherein a sensing current flows in the light sensing element according to received light; and a collimator layer disposed on the light sensing layer and including a light guide unit guiding light to the light sensing element. The light guide unit includes: a light-transmitting unit configured to provide light to the light sensing element; and a first light-blocking unit disposed on an inner surface of the light-transmitting unit.

In an exemplary embodiment of the present inventive concept, the collimator layer further includes a second light-blocking unit disposed on an outer surface of the light-transmitting unit.

In an exemplary embodiment of the present inventive concept, a refractive index of the first light-blocking unit is smaller than a refractive index of the light-transmitting unit, and a refractive index of the second light-blocking unit is smaller than the refractive index of the light-transmitting unit.

In an exemplary embodiment of the present inventive concept, an area of an upper surface of the light guide unit is larger than an area of an upper surface of the first light-blocking unit.

In an exemplary embodiment of the present inventive concept, a cross-sectional area of the first light-blocking unit decreases toward the light sensing layer.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
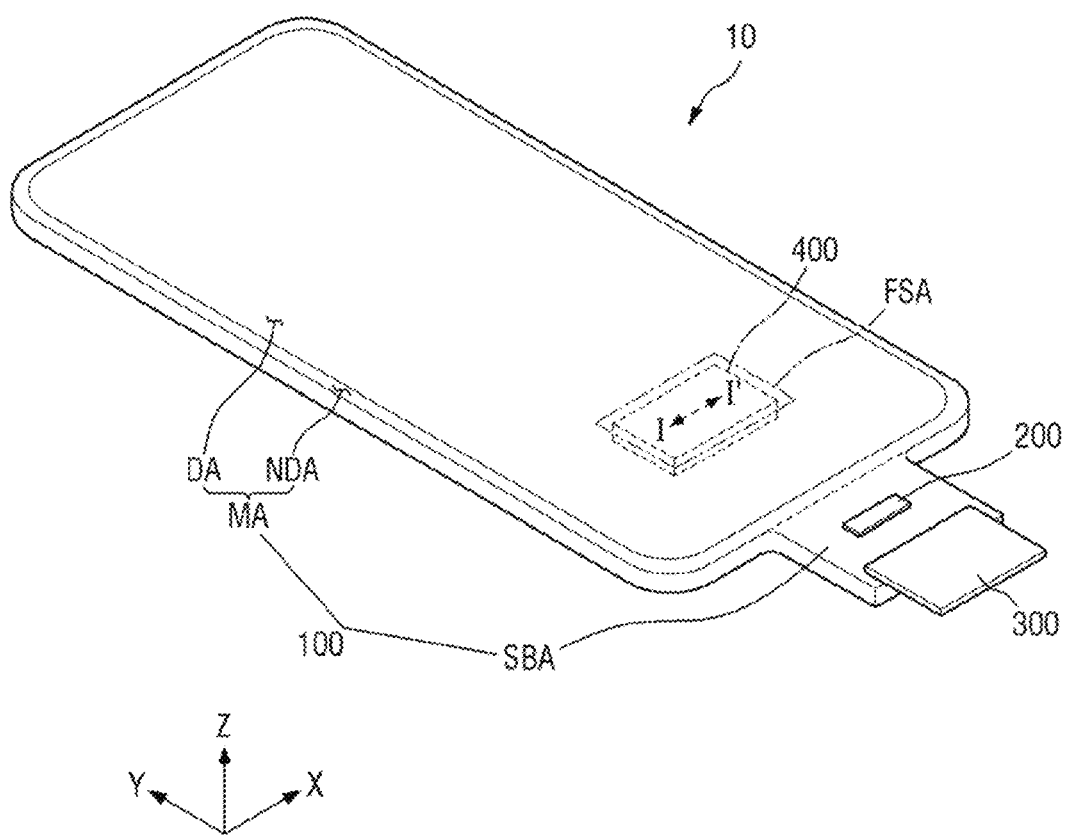
FIG. 1 is a perspective view of a display device according to an exemplary embodiment of the present inventive concept.

Exemplary embodiments of the present inventive concept will be described more fully hereinafter with reference to the accompanying drawings. Like reference numerals may refer to like elements throughout the accompanying drawings, and thus, their descriptions may be omitted.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between components may be interpreted in a like fashion.

It will be further understood that descriptions of features or aspects within each exemplary embodiment of the present inventive concept are applicable to other similar features or aspects in other exemplary embodiments of the present inventive concept, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, in the example, "below" and "under" can encompass both an orientation of above and below. The device may be otherwise oriented (e.g., rotated 90 degrees or at other orientations) and the spatially relative descriptors used herein may be interpreted accordingly.

FIG. 1 is a perspective view of a display device according to an exemplary embodiment of the present inventive concept.

Referring to FIG. 1, a display device 10 is for displaying moving images or still images. The display device 10 may be used as the display screen of portable electronic devices such as a mobile phone, a smart phone, a tablet personal computer (PC), a smart watch, a watch phone, a mobile communications terminal, an electronic notebook, an electronic book, a portable multimedia player (PMP), a navigation device and an ultra mobile PC (UMPC), as well as the display screen of various products such as a television, a notebook, a monitor, a billboard and the Internet of Things.

The display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and a micro light-emitting display device using micro light-emitting diodes (LED). In the following description, an organic light-emitting display device is described as an example of the display device 10. It is, however, to be understood that the present inventive concept is not limited thereto.

The display device 10 includes a display panel 100, a display driving circuit 200, a circuit board 300 and a fingerprint sensor 400.

The display panel 100 may have a rectangular shape having shorter sides in as first direction (e.g., an x-axis direction) and longer sides in a second direction (y-axis direction) intersecting the first direction (e.g., the x-axis direction). In addition, the display panel 100 may be parallel to a plane formed by the first direction (x-axis direction) and the second direction (y-axis direction). For example, each of the corners where the short side in the first direction (x-axis direction) meets the longer side in the second direction (y-axis direction) may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be formed flat, but is not limited thereto. For example, the display panel 100 may be formed at left and right ends, and may include a curved portion having a constant curvature or a varying curvature. In addition, the display panel 100 may be formed to be flexible so that it can be curved, bent, folded or rolled.

The substrate SUB may include the main area MA and the subsidiary area SBA.

The main area MA may include a display area DA where images are displayed, and as non-display area NDA around the display area DA. The display area DA may include a plurality of pixels for displaying images. The non-display area NDA may be the area from the outer side of the display area DA to the edge of the display panel 100.

The display area DA may include a fingerprint sensing area FSA. The fingerprint sensing area FSA refers to an area where the fingerprint sensor 400 is disposed. The fingerprint sensing area FSA may be, but is not limited to, a part of the display area DA as shown in FIG. 1. For example, the fingerprint sensing area FSA may be formed throughout the entire display area DA and may be substantially identical to the display area DA.

The subsidiary area SBA may protrude from one side of the main area MA in the second direction (y-axis direction). The width of the subsidiary area SBA in the fast direction (x-axis direction) may be smaller than the width of the main area MA in the first direction (x-axis direction). The length of the subsidiary area SBA in the second direction (y-axis direction) may be smaller than the length of the main area MA in the second direction (y-axis direction). It is, however, to be understood that the present inventive concept is not limited thereto.

Although the subsidiary area SBA is unfolded in the example shown in FIG. 1, the subsidiary area SBA may be bent and may be disposed on the lower surface of the display panel 100. When the subsidiary area SBA is bent, it may overlap the main area MA in the thickness direction (z-axis direction) of the substrate SUB. The display driver circuit 200 may be disposed in the subsidiary area SBA.

The display driving circuit 200 may generate signals and voltages for driving the display panel 100. The display driving circuit 200 may be implemented as an integrated circuit (IC) and may be attached to the display panel 10 by, for example, a chip on glass (COG) technique, a chip on plastic (COP) technique, or an ultrasonic bonding. It is, however, to be understood that the present inventive concept is not limited thereto. For example, the display driving circuit 200 may be attached on the circuit board 300 by the chip-on-film (COF) technique.

The circuit board 300 may be attached to an end of the subsidiary area SBA of the display panel 100 using, for example, an anisotropic conductive film. Accordingly, the circuit board 300 may be electrically connected to the display panel 100 and the display driving circuit 200. The display panel 100 and the display driving circuit 200 may receive digital video data, timing signals, and driving voltages through the circuit board 300. For example, the circuit board 300 may be a flexible printed circuit board, a printed circuit board, or a flexible film such as a chip on film.

The fingerprint sensor 400 may be disposed on the lower surface of the display panel 100. The fingerprint sensor 400 may be attached on the lower surface of the display panel 100 using a transparent adhesive member. For example, the transparent adhesive member may be a transparent adhesive film such as an optically clear adhesive (OCA) film or a transparent adhesive resin such as an optically clear resin (OCR).

Figure 2:
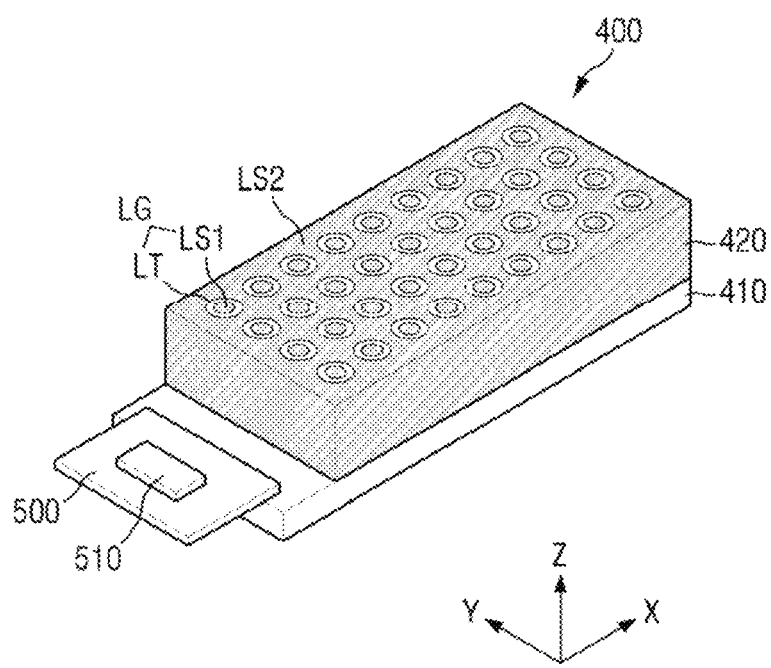
FIG. 2 is a perspective view illustrating the fingerprint sensor of FIG. 1.

FIG. 2 is a perspective view illustrating the fingerprint sensor of FIG. 1.

Referring to FIG. 2, the fingerprint sensor 400 may include a fingerprint sensing layer 410 (e.g., a light sensing layer) and a collimator layer 420.

The fingerprint sensing layer 410 may include sensor pixels arranged in the first direction (x-axis direction) and the second direction (y-axis direction). Each of the sensor pixels may include a light sensing element, at least one transistor and at least one capacitor. A sensing current may flow through the light sensing element according to incident light, and the at least one transistor may be connected to the light sensing element. The at least one capacitor may be connected to the light sensing element or the transistor. For example, the light sensing element may be a photo-diode or a photo-transistor.

The collimator layer 420 is disposed on the fingerprint sensing layer 410. The collimator layer 420 includes light guide units LG arranged in the first direction (x-axis direction) and the second direction (y-axis direction), and a second light-blocking unit LS2 disposed among the light guide units LG. Each of the light guide units LG includes a light-transmitting unit LT and a first light-blocking unit LS1. The light-transmitting unit LT may transmit light, and the first light-blocking unit LS1 and the second light-blocking unit LS2 may block light. The light-transmitting unit LT has an annular shape when viewed from the top as shown in FIG. 2, and the first light-blocking unit LS1 may have a circular shape when viewed from the top. It is, however, to be understood that the present disclosure is not limited thereto. For example, the first light-blocking unit LS1 may have an elliptical or polygonal shape when viewed from the top.

A fingerprint circuit board 500 may be disposed on a portion of the fingerprint sensing layer 410 that is not covered by the collimator layer 420. The fingerprint circuit board 500 may be attached to the portion of the upper surface of the fingerprint sensing layer 410 that is not covered by the collimator layer 420 using an anisotropic conductive film. Accordingly, the fingerprint circuit board 500 may be electrically connected to sensor pixels of the fingerprint sensing layer 410. Therefore, each of the sensor pixels of the fingerprint sensing layer 410 may output a sensing voltage according to the sensing current of the light sensing element through the fingerprint circuit board 500. A fingerprint driver circuit 510 electrically connected to the fingerprint circuit board 500 may recognize a fingerprint pattern of a finger based on sensing voltages of sensor pixels.

The fingerprint driver circuit 510 may be disposed, but is not limited to, on the fingerprint circuit board 500 as shown in FIG. 2. For example, the fingerprint driver circuit 510 may be disposed on a separate circuit board that is electrically connected to the fingerprint circuit board 500. The fingerprint circuit board 500 may be a flexible printed circuit board, a printed circuit board, or a flexible film such as a chip-on film.

Figure 3:
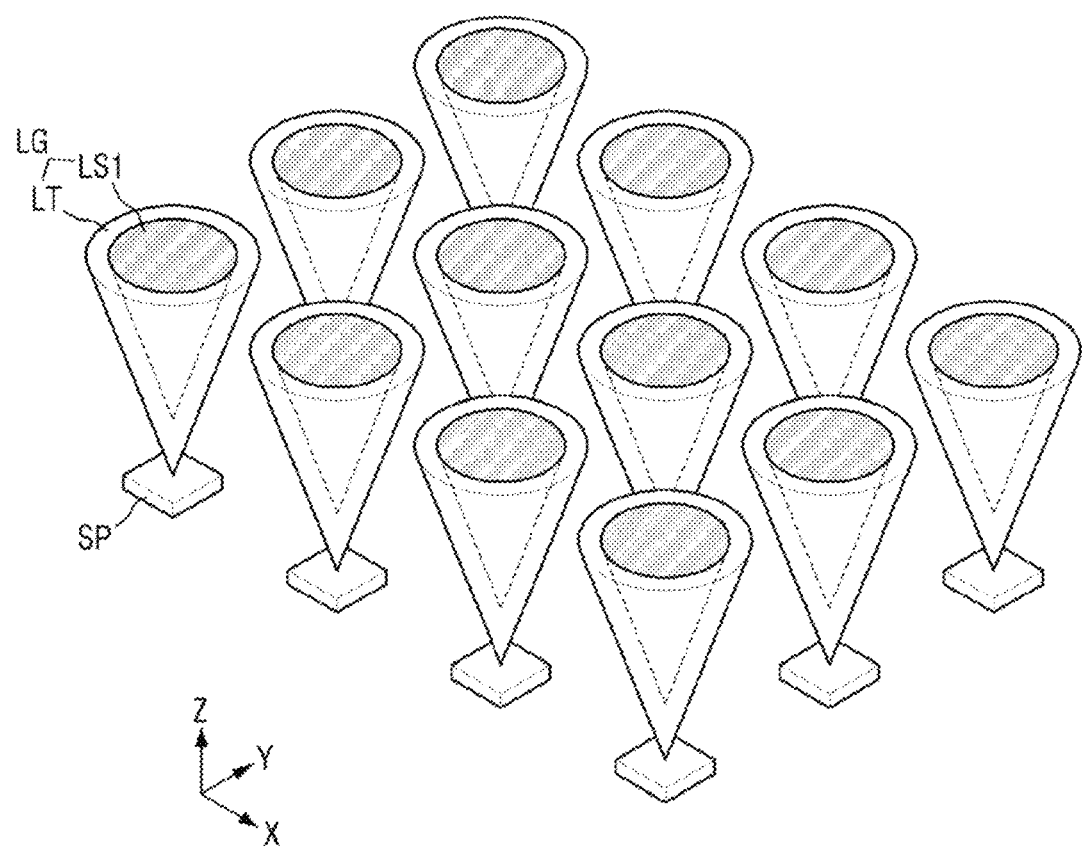
FIG. 3 is a view illustrating the sensor pixels of the light sensing layer and the light guide units of the collimator layer of FIG. 2.
Figure 4:
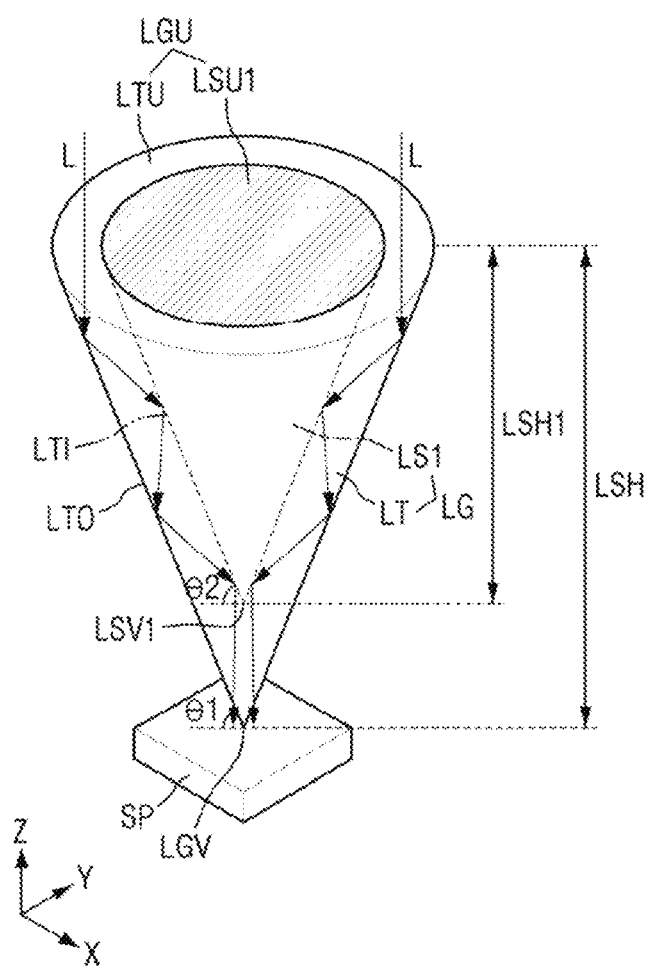
FIG. 4 is an enlarged view illustrating the sensor pixels and the light guide units of FIG. 3 according to an exemplary embodiment of the present inventive concept.

FIG. 3 is a view illustrating the sensor pixels of the light sensing layer and the light guide units of the collimator layer of FIG. 2. FIG. 4 is an enlarged view illustrating the sensor pixels and the light guide units of FIG. 3 according to an exemplary embodiment of the present inventive concept.

Referring to FIGS. 3 and 4, the sensor pixels SP may be associated with the light guide units LG, respectively. The sensor pixels SP may overlap the light guide units LG in the third direction (z-axis direction), respectively. The light guide units LG may be disposed on the sensor pixels SP, respectively.

Each of the light guide units LG may have, for example, a cone shape. The upper surface LGU of a light guide unit LG may be the base of a cone, and the vertex LGV of the light guide unit LG may be the apex of the cone. The upper surface LGU of the light guide unit LG may include an upper surface of the light-transmitting unit LT and an upper surface of the first light-blocking unit LS1. The upper surface LGU of the light guide unit LG may have, but is not limited to, a circular shape when viewed from the top. For example, when the light guide unit LG has an elliptical cone shape, the upper surface LGU of the light guide unit LG may have an elliptical shape when viewed from the top. In addition, when the light guide unit LG has a polypyramid shape, the upper surface LGU of the light guide unit LG may have a polygonal shape when viewed from the top.

Each of the light guide units LG may include the light-transmitting unit LT and the first light-blocking unit LS1. The light-transmitting unit L1 may be made of a material that can transmit light, and the first light-blocking unit LS1 may be made of a material that can block light. For example, the light-transmitting unit LT may be made of a transparent organic film or an inorganic film that can transmit light. For example, the first light-blocking unit LS1 may be made of an organic film that can block light.

The first light-blocking unit LS1 may have a cone shape. The upper surface LSU1 of the first light-blocking unit LS1 may be the base of the cone, and the vertex LSV1 of the first light-blocking unit LS1 may be the apex of the cone. The upper surface LSU1 of the first light-blocking unit LS1 may have, but is not limited to, a circular shape when viewed from the top. For example, when the first light-blocking unit LS1 has an elliptical cone shape, the upper surface LSU1 of the first light-blocking unit LS1 may have an elliptical shape when viewed from the top. In addition, when the first light-blocking unit LS1 has a polypyramid shape, the upper surface LSU1 of the first light-blocking unit LS1 may have polygonal shape.

In an exemplary embodiment of the present inventive concept, the light transmitting unit LT may include an opening, and the first light blocking unit LS1 may have a shape that corresponds to the shape of the opening in the light transmitting unit LT.

The area of the upper surface LSU1 of the first light-blocking unit LS1 may be smaller than the area of the upper surface LGU of the light guide unit LG. The diameter of the upper surface LSU1 of the first light-blocking unit LS1 may be smaller than the diameter of the upper surface LGU of the light guide unit LG. The height LSH1 of the first light-blocking unit LS1 may be smaller than the height LGH of the light guide unit LG. Therefore, the size of the first light-blocking unit LS1 (e.g., the surface area or volume) may be smaller than the size of the light guide unit LG.

The first light-blocking unit LS1 may have a circular cross-sectional shape when it is cut in the first direction (x-axis direction) or the second direction (y-axis direction). Since the first light-blocking unit LS1 has a cone shape, the cross-sectional area of the first light-blocking unit LS1 may vary along the third direction (z-axis direction). For example, the cross-sectional area, in the third direction (z-axis direction), of the first light-blocking unit LS1 may be reduced toward the sensor pixel SP.

The light-transmitting unit LT may be the remaining area of the light guide unit LG except for the first light-blocking unit LS1. The upper surface LTU of the light-transmitting unit LT may have an annular shape when viewed from the top. The first light-transmitting unit LT may have an annular cross-sectional shape when it is cut in the first direction (x-axis direction) or the second direction (y-axis direction), from a plan view.

The inner surface LTI of the light-transmitting unit LT may be in contact with the first light-blocking unit LS1, and the outer surface LTO thereof may be in contact with the second light-blocking unit LS2. The inner surface LTI of the light-transmitting unit LT may be surrounded by the first light-blocking unit LS1. The outer surface LTO of the light-transmitting unit LT may be surrounded by the second light-blocking unit LS2. The inner surface LTI of the light-transmitting unit LT may be the interface between the light-transmitting unit LT and the first light-blocking unit LS1, and the outer surface LTO thereof may be the interface between the second light-blocking unit LS2 and the light-transmitting unit LT.

The refractive index of the light-transmitting unit LT may be greater than the refractive index of the first light-blocking unit LS1. The refractive index of the light-transmitting unit LT may be greater than the refractive index of the second light-blocking unit LS2. When an angle of incidence of light traveling in the light-transmitting unit LT toward the first light blocking unit LS1 is greater than the critical angle, the light may not travel into the first fight-blocking unit LS1 but may be reflected at the inner surface LTI of the light-transmitting unit LT. In addition, when an angle of incidence of light traveling in the light transmitting unit LT toward the second light-blocking unit LS2 is greater than the critical angle, the light may not travel into the second light-blocking unit LS2 but may be reflected at the outer surface LTO of the light-transmitting unit LT. Accordingly, some of the fight incident on the light-transmitting unit LT may be repeatedly reflected between the outer surface LTO and the inner surface LTI of the light-transmitting unit LT, so that it can reach the sensor pixel SP.

Figure 7:
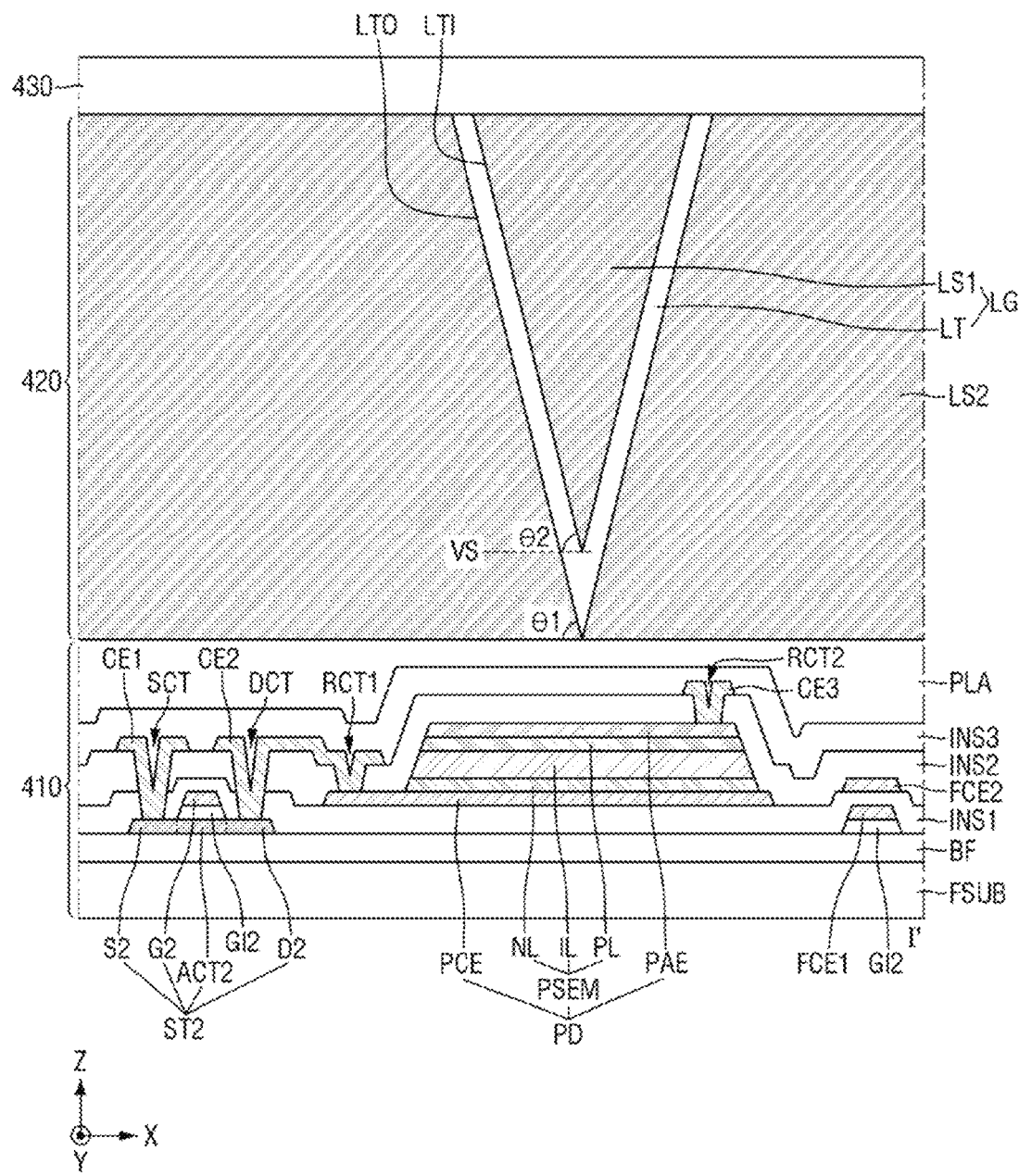
FIG. 7 is an enlarged cross-sectional view illustrating the fingerprint sensor of area A of FIG. 5 according to an exemplary embodiment of the present inventive concept.

The incidence angle of light incident on the light-transmitting unit LT is measured with respect to the normal drawn vertically from the upper surface of the light-transmitting unit LT. In FIG. 4, light is incident to the light-transmitting unit LT vertically from the upper surface of the light-transmitting unit LT. For example, the incidence angle of light incident on the light-transmitting unit LT is 0°. The outer surface LTO of the light-transmitting unit LT may be inclined at a first angle θ1 from the upper surface of the sensor pixel SP, and the inner surface LTI of the light-transmitting unit LT may be inclined at a second angle θ2 front the sensor pixel SP. The upper surface of the sensor pixel SP may be the upper surface of the planarization layer PLA of the light sensing layer 410 as shown in FIG. 7. The first angle θ1 may be, hut is not limited to being, equal to the second angle θ2.

Incidentally, noise light may be ambient light that is not incident on the neighboring sensor pixel SP and has an incidence angle larger than a predetermined angle. The larger the incidence angle of the light incident on the light-transmitting unit LT, the larger the incidence angle of the light incident on the first light-blocking unit LS1 or the second light-blocking unit LS2. Therefore, the light may not be totally reflected off the outer surface LTO of the light-transmitting unit LT but may be absorbed by the first light-blocking unit LS1 or the second light-blocking unit LS2. For example, since the noise light is absorbed by the second light-blocking unit LS2, it is possible to suppress noise light incident on the light sensing element PD through the light-transmitting unit LT.

The width of the upper surface LTU of the light-transmitting unit LT may range from about 0.8 μm to 2.0 μm so that red light, green light and blue light output from the display panel 100 can pass through it. For example, the width of the upper surface LTU of the light-transmitting unit LT may range from about 0.8 μm to about 1.0 μm.

The light incident on the light-transmitting unit can be incident on the sensor pixel SP by Fraunhofer diffraction if the following condition is met.

$$a^2/\lambda \times z \ll 1$$ [Mathematical Relationship 1]

where "a" denotes the maximum diameter of the guide unit LG that allows light to be diffused, "z" denotes the height of the light guide unit LG, and "λ" denotes the wavelength of the light incident on the light-transmitting unit LT.

According to Mathematical Relationship 1, the diameter "a" of the light guide unit LG may be determined based on the height LGH of the light guide unit LG. When the height LGH of the light guide unit LG may be equal to or less than about 100 μm, the diameter "a" of the light guide unit LG may be equal to or less than approximately 9 μm, so that the collimator layer 420 can be formed relatively thin.

As shown in FIGS. 3 and 4, by designing the fingerprint sensor so that the light incident on the light-transmitting unit LT is incident on the sensor pixel SP by Fraunhofer diffraction, the height of the light guide unit LG can be about 100 μm or less. As a result, the relatively thin collimator layer 420 can be formed.

In addition, since the larger the incidence angle of the light incident on the light-transmitting unit LT, the larger the incidence angle of the light incident on the second light-blocking unit LS2 and the noise light can be absorbed by the first light-blocking unit LS1 or the second light-blocking unit LS2 without being reflected at the outer surface of the light-transmitting unit LT. Therefore, it is possible to suppress noise light incident on the light sensing element PD through the light-transmitting unit LT.

Moreover, since the light-transmitting unit LT, the first light-blocking unit LS1 and the second light-blocking unit LS2 of the collimator layer 420 utilize the total reflection, there is no metal layer containing a separate metal material. Therefore, it is possible to reduce noise light which otherwise may be generated by light reflection of the metal layer.

Figure 5:
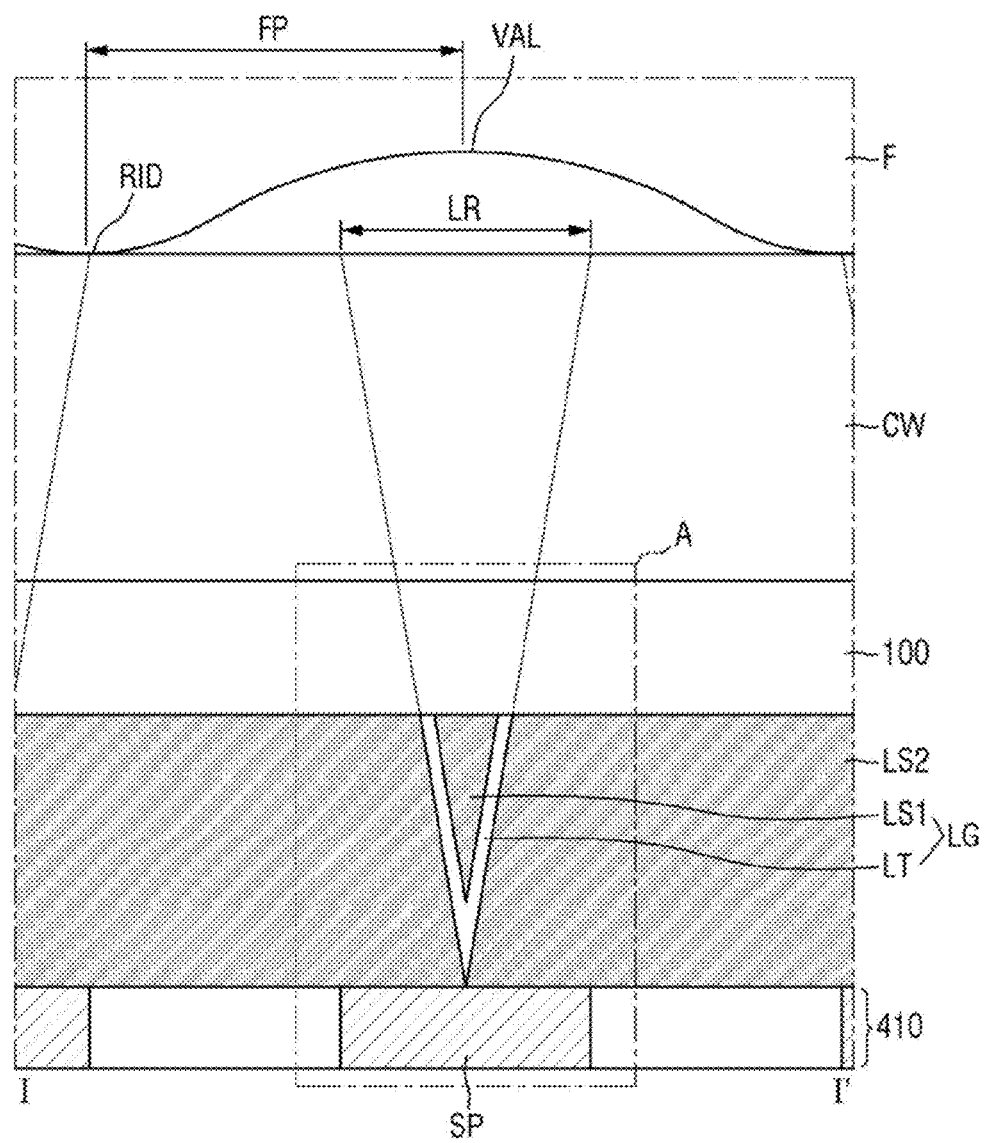
FIG. 5 is a cross-sectional view illustrating the display panel and the fingerprint sensor taken along line I-I' of FIG. 1.

FIG. 5 is a cross-sectional view illustrating the display panel and the fingerprint sensor taken along line I-I' of FIG. 1. FIG. 5 shows an example where a user has touched on the display device 10 with her/his finger F for fingerprint recognition.

Referring to FIG. 5 the display device 10 further includes a cover window CW disposed an the upper surface of the display panel 100. The cover window CW may be disposed an the display panel 100 so that it covers the upper surface of the display panel 100. The cover window CW can protect the upper surface of the display panel 100. The cover window CW may be attached to the upper surface of the display panel 100 using a transparent adhesive member.

The cover window CW may be made of a transparent material such as glass and plastic. For example, when the cover window CW is glass, it may be ultra thin glass (UTG) having a thickness of about 0.1 mm or less. When the cover window CW is made of plastic, it may include a transparent polyimide film.

The fingerprint sensor 400 may be disposed on the lower surface of the display panel 100. The fingerprint sensor 400 may be attached on the lower surface of the display panel 100 using a transparent adhesive member.

The fingerprint sensor 400 may include a fingerprint sensing layer 410 including sensor pixels SP, and a collimator layer 420 including light guide units LG and a second light-blocking unit LS2. The sensor pixels SP may correspond with the light guide units LG, respectively. The sensor pixels SP may overlap the light guide units LG in the third direction (z-axis direction), respectively. The light guide units LG may be disposed on the sensor pixels SP, respectively.

The light-transmitting unit LT of the light guide unit LG may be a passage through which light reflected off the ridges RID and valleys VAL of the fingerprint of a finger F is incident. For example, when a user's finger F is brought into contact with the cover window CW, the light output from the display panel 100 may be reflected off the ridges RID and valleys VAL of the fingerprint of the finger F. The light reflected off the finger F can be incident on the sensor pixels SP of the fingerprint sensing layer 410 through the light-transmitting unit LT of the light guide unit LG of the display panel 100.

The range of light LR incident on the sensor pixels SP through the openings of the collimator layer 420 may be shorter than the distance FP between the ridge RID and the valley VAL of the fingerprint of the linger F. The distance FP between the lowest point of the ridge RID and the highest point of the valley VAL of the finger F may be approximately 500 μm. Accordingly, the sensing current flowing through the light sensing element of each of the sensor pixels SP may be different depending on whether the light is reflected from the ridges or valleys of the fingerprint of the finger F. Therefore, the sensing voltages output from the sensor pixels SP may be different depending on whether the light is reflected from the ridges or valleys of the fingerprint of the finger F. In this manner, the fingerprint driver circuit 510 can recognize a fingerprint pattern of the finger F according to the sensing voltages of the sensor pixels SP.

Figure 6:
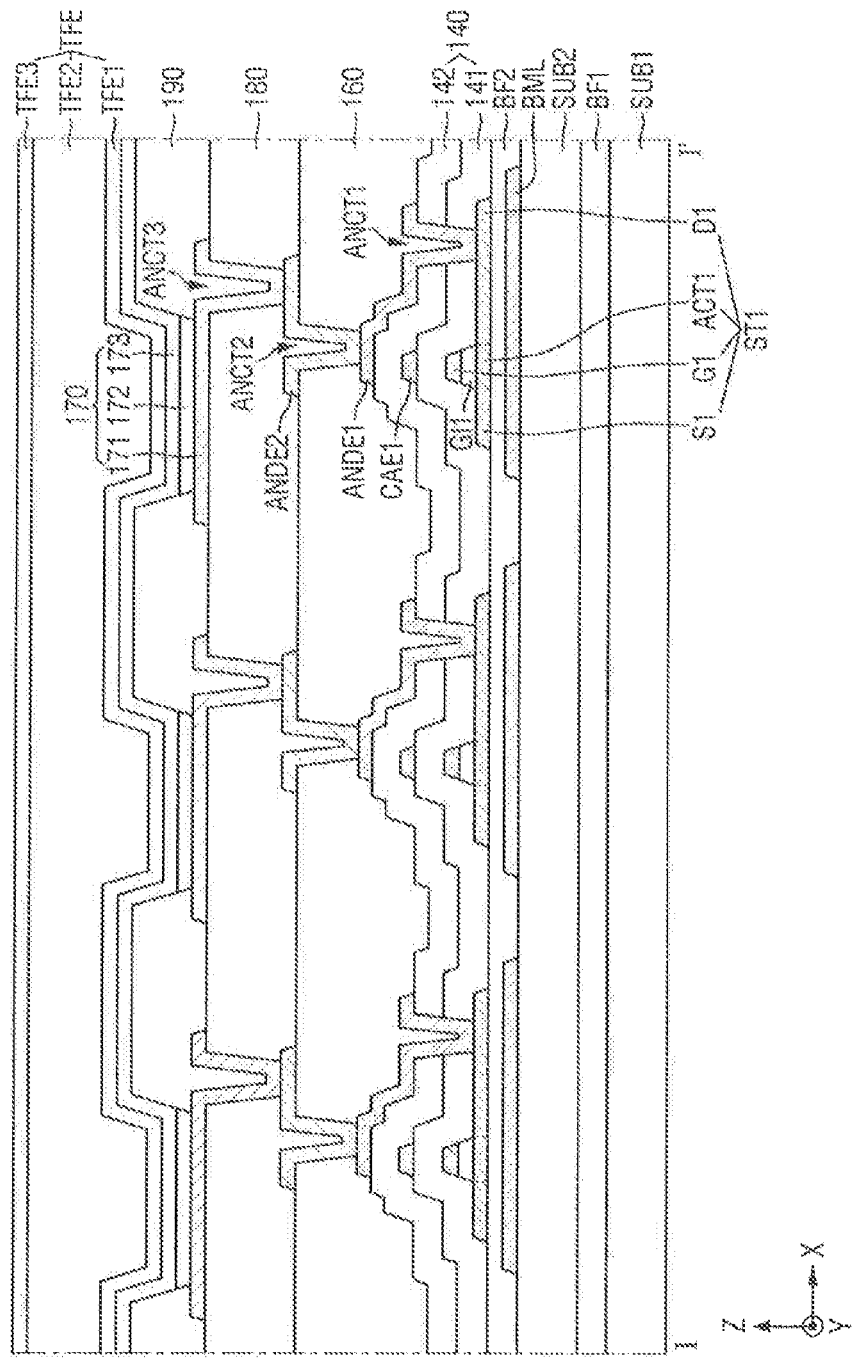
FIG. 6 is an enlarged cross-sectional view illustrating the display panel of area A of FIG. 5 according to an exemplary embodiment of the present inventive concept.

FIG. 6 is an enlarged cross-sectional view illustrating the display panel of area A of FIG. 5.

Referring to FIG. 6, the display panel 100 may include display pixels DP displaying images. Each of the display pixels DP may include a first thin-film transistor ST1 and a light-emitting element 170.

A first buffer film BF1 may be disposed on a first substrate SUB1, and a second substrate SUB2 may be disposed on the first buffer film BF1. For example, the first buffer film BF1 may be disposed between the first substrate SUB1 and the second substrate SUB2. A second buffer film BF2 may be disposed on the second substrate SUB2.

Each of the first substrate SUB1 and the second substrate SUB2 may be made of an insulating material such as a polymer resin. For example, the first substrate SUB1 and the second substrate SUB2 may include polyimide. Each of the first substrate SUB1 and the second substrate SUB2 may be a flexible substrate that can be bent, folded, rolled, and so on.

Each of the first buffer layer BF1 and the second buffer layer BF2 is a layer that may protect the thin-film transistors ST1 and an emissive layer 172 of an emission material layer from moisture permeating through the first substrate SUB1 and the second substrate SUB2, which may be vulnerable to moisture permeation. For example, each of the first buffer layer BF1 and the second buffer layer BF2 may be made up of multiple inorganic layers alternately stacked on one another. For example, each of the first and second buffer layers BF1 and BF2 may be made up of multiple layers in which one or more inorganic layers of a silicon nitride layer, a silicon oxynitride layer, a silicon oxide layer, a titanium oxide layer and/or an aluminum oxide layer are alternately stacked on one another.

A light-blocking layer BML may be disposed on the second substrate SUB2. The light blocking layer BML may overlap a first active layer ACT1 of the first thin-film transistor ST1 in the third direction (z-axis direction) to prevent leakage current when the light is incident on the first active layer ACT1 of the first thin-film transistor ST1. The light-blocking layer BML may be made up of a single layer or multiple layers including at least one of molybdenum (Mo), aluminum (Al), chromium (Cr), gold (Au), titanium (Ti), nickel (Ni), neodymium (Nd) and copper (Cu) or an alloy thereof. However, the present inventive concept is not limited thereto. For example, the light blocking layer BML may be omitted.

The first active layer ACT1 of the first thin-film transistor ST1 may be disposed on the second buffer layer BF2. The first active layer ACT1 of the first thin-film transistor ST1 includes, for example, polycrystalline silicon, monocrystalline silicon, low-temperature polycrystalline silicon, amorphous silicon, or an oxide semiconductor. Portions of the first active layer ACT1 of the first thin-film transistor ST1 that are not covered by the first gate insulating layer GI1 are doped with impurities or ions, and those portions can have conductivity. Therefore, a first source electrode S1 and a first drain electrode D1 of the first active layer ACT1 of the first thin-film transistor ST1 may be formed.

The first gate insulating layer GI1 may be disposed on the first active layer ACT1 of the first thin-film transistor ST1. Although the first gate insulating layer GI1 is disposed between a first gate electrode G1 and the first active layer ACT1 of the first thin-film transistor ST1 in the example shown in FIG. 4, the present inventive concept is not limited thereto. The first gate insulating layer GI1 may be disposed between a first interlayer dielectric layer 141 and the first active layer ACT1 and between the first interlayer dielectric layer 141 and the second buffer layer BF2 as well. The first gate insulating layer GI1 may be formed of an inorganic layer, for example, a silicon nitride layer, a silicon oxynitride layer, a silicon oxide layer, a titanium oxide layer, and/or an aluminum oxide layer.

The first gate electrode G1 of the first thin-film transistor ST1 may be disposed on the first gate insulating layer GI1. The first gate electrode G1 of the first thin-film transistor ST1 may overlap the first active layer ACT1 in the third direction (z-axis direction). For example, the first gate electrode G1 may overlap a channel area of the first active layer ACT1. The first gate electrode G1 of the first thin-film transistor ST1 may be made up of a single layer or multiple layers including at least one of molybdenum (Mo), aluminum (Al), chromium (Cr), gold (Au), titanium (Ti), nickel (Ni), neodymium (Nd) and copper (Cu) or an alloy thereof.

The first interlayer dielectric layer 141 may be disposed on the first gate electrode G1 of the first thin-film transistor ST1. The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may include a number of inorganic layers.

A first capacitor electrode CAE1 may be disposed on the first interlayer dielectric layer 141. The first capacitor electrode CAE1 may overlap the first gate electrode of the first thin-film transistor ST1 in the third direction (z-axis direction). Since the first interlayer dielectric layer 141 has a predetermined dielectric constant, a capacitor can be formed by the first capacitor electrode CAE1, the first gate electrode G1, and the first interlayer dielectric layer 141 disposed between them. The first capacitor electrode CAE1 may be made up of a single layer or multiple layers including at least one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed over the first capacitor electrode CAE1. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may include a number of inorganic layers.

A first anode connection electrode ANDE1 may be disposed on the second interlayer dielectric layer 142. The first anode connection electrode ANDE1 may be connected to a first drain electrode D of the first thin-film transistor ST1 through a first anode contact hole ANCT1 that penetrates the first interlayer dielectric layer 141 and the second interlayer dielectric layer 142 to expose the first drain electrode D1 of the first thin-film transistor ST1. The first anode connection electrode ANDE1 may be made up of a single layer or multiple layers including at least one of molybdenum (Mo), aluminum (Al), chromium (Cr) gold (Au), titanium (Ti), nickel (Ni), neodymium (Nd) and copper (Cu) or an alloy thereof.

A first organic layer 160 may be disposed on the first anode connection electrode ANDE1 for planarization. The first organic layer 160 may be formed as an organic layer such as an acryl resin, an epoxy resin, a phenolic resin, a polyamide resin and a polyimide resin.

A second anode connection electrode ANDE2 may be disposed on the first organic layer 160. The second anode connection electrode ANDE2 may be connected to the first anode connection electrode ANDE1 through a second anode contact hole ANCT2 that penetrates through the first organic layer 160 to expose the first anode connection electrode ANDE1. The second anode connection electrode ANDE2 may be made up of a single layer or multiple layers including at least one of molybdenum (Mo), aluminum (Al), chromium (Cr), gold (Au), titanium (Ti), nickel (Ni), neodymium (Nd) and copper (Cu) or an alloy thereof.

A second organic layer 180 may be disposed on the second anode connection electrode ANDE2. The second organic layer 180 may be formed as an organic layer such as an acryl resin, an epoxy resin, a phenolic resin, a polyamide resin and a polyimide resin.

In FIG. 6, the first thin-film transistor ST1 is implemented as a top-gate transistor in which the first gate electrode G1 is located above the first active layer ACT1. It is, however, to be understood that the present inventive concept is not limited thereto. The first thin-film transistor ST1 may be implemented as a bottom-gate transistor in which the first gate electrode G1 is located below the first active layer ACT1, or as a double-gate transistor in which the first gate electrodes G1 are disposed above and below the first active layer ACT1.

Light-emitting elements 170 and a bank 190 may be disposed on the second organic layer 180. Each of the light-emitting elements 170 may include a first light-emitting electrode 171, an emissive layer 172 and a second light-emitting electrode 173.

The first light-emitting electrode 171 may be formed on the second organic layer 180. The first light-emitting electrode 171 may be connected to the second anode connection electrode ANDE2 through a third anode contact hole ANCT3 that penetrates through the second organic layer 180 to expose the second anode connection electrode ANDE2.

In the top-emission organic light-emitting diode in which light exits from the emissive layer 172 toward the second light-emitting electrode 173, the first light-emitting electrode 171 may be made or, for example, a metal material having a high reflectivity such as a stack structure of aluminum and titanium (Ti/Al/Ti), a stack structure of aluminum and ITO (ITO/Al/ITO), an APC alloy, and a stack structure of APC alloy and ITO (ITO/APC/ITO). The APC alloy is an alloy of silver (Ag), palladium (Pd) and copper (Cu).

The bank 190 may partition the first light-emitting electrode 171 on the second organic layer 180 to provide an emission area EA. The bank 190 may be formed to cover the edge of the first light-emitting electrode 171. The bank 190 may be formed of an organic layer such as an acryl resin, an epoxy resin, a phenolic resin, a polyamide resin and a polyimide resin.

In the emission area, the first light-emitting electrode 171, the emissive layer 172 and the second light-emitting electrode 173 are stacked on one another sequentially, so that holes from the first light-emitting electrode 171 and electrons from the second light-emitting electrode 173 are combined with each other in the emissive layer 172 to emit light.

The emissive layer 172 is formed on the first light-emitting electrode 171. Further, the emissive layer 172 is formed on the emission area of the first light-emitting electrode 171. The emissive layer 172 may include an organic material and emit light of a certain color. For example, the emissive layer 172 may include a hole transporting layer, an organic material layer, and an electron transporting layer.

The second light-emitting electrode 173 is formed on the emissive layer 172. For example, the second light-emitting electrode 173 may be formed to cover the emissive layer 172. The second light-emitting electrode 173 may be a common layer formed across all of the emission areas. A capping layer may be formed on the second light-emitting electrode 173.

In the top-emission structure, the second light-emitting electrode 173 may be formed of a transparent conductive oxide (TCO) such as indium tin oxide (ITO) and indium zinc oxide (IZO) that can transmit light, or a semi-transmissive conductive material such as magnesium (Mg), silver (Ag) and an alloy of magnesium (Mg) and silver (Ag). When the second light-emitting electrode 173 is formed of a semi-transmissive conductive material, the light extraction efficiency can be increased by using microcavities.

An encapsulation layer TFE may be disposed on the second light-emitting electrode 173. The encapsulation layer TFE includes at least one inorganic layer to prevent permeation of oxygen or moisture into the light-emitting element 170. In addition, the encapsulation layer TFE includes at least one organic layer to protect the light-emitting element 170 from foreign substances such as dust. For example, the encapsulation layer TFE includes a first inorganic layer TFE1, an organic layer TFE2 and a second inorganic layer TFE3.

The first inorganic layer TFE1 may be disposed on the second light-emitting electrode 173, and the organic layer TFE2 may be disposed on the first inorganic layer TFE1. In addition, the second inorganic layer TFE3 may be disposed on the organic layer TFE2. The first inorganic layer TFE1 and the second inorganic layer TFE3 may be made up of multiple layers in which one or more inorganic layers are alternately stacked on one another. For example, the first inorganic layer TFE1 and the second inorganic layer TFE3 may include at least one of a silicon nitride layer, a silicon oxynitride layer, a silicon oxide layer, a titanium oxide layer and/or an aluminum oxide layer. For example, the organic layer TFE2 may be a monomer.

FIG. 7 is an enlarged cross-sectional view illustrating the fingerprint sensor of area A of FIG. 5 according to an exemplary embodiment of the present inventive concept.

Referring to FIG. 7, a fingerprint sensor 400 may include a fingerprint sensing layer 410 and a collimator layer 420 disposed on the fingerprint sensing layer 410.

The fingerprint sensing layer 410 may include sensor pixels SP sensing light. Each of the sensor pixels SP may include a second thin-film transistor ST2 and a light sensing element PD.

A buffer layer BF may be disposed on a fingerprint sensor substrate FSUB. The fingerprint sensor substrate FSUB may be made of an insulating material such as a polymer resin. For example, the fingerprint sensor substrate FSUB may include polyimide. For example, each fingerprint sensor substrate FSUB may be a flexible substrate that can be bent, folded, or rolled.

The buffer layer BF may protect the second thin-film transistor ST2 and the light sensing element PD of the fingerprint sensing layer 410 from moisture permeating through the fingerprint sensor substrate FSUB, which may be vulnerable to moisture permeation. The buffer layer BF may be formed of a plurality of inorganic layers stacked on one another alternately. For example, the buffer layer BF may be made up of multiple layers including one or more inorganic layers of a silicon nitride layer, a silicon oxynitride layer, a silicon oxide layer, a titanium oxide layer and/or an aluminum oxide layer alternately stacked on one another.

A second active layer ACT2 of the second thin-film transistor ST2 may be disposed on the buffer layer BF. The second active layer ACT2 of the second thin-film transistor ST2 may include polycrystalline silicon, monocrystalline silicon, low-temperature polycrystalline silicon, amorphous silicon, and/or an oxide semiconductor. Portions of the second active layer ACT2 of the second thin-film transistor ST2 are not covered by the second gate insulating layer GI2 are doped with impurities or ions, and those portions can have conductivity. Therefore, the second source electrode S2 and the second drain electrode D2 of the second active layer ACT2 of the second thin-film transistor ST2 may be formed.

The second gate insulating layer GI2 may be disposed on the second active layer ACT2 of the second thin-film transistor ST2. Although the second gate insulating layer GI2 is disposed between the second gate electrode G2 and the second active layer ACT2 of the second thin-film transistor ST2 and between the first fingerprint capacitor electrode FCE1 and the buffer layer BF in the example shown in FIG.

5, the present inventive concept is not limited thereto. The second gate insulating layer GI2 may be disposed between the first insulating layer INS1 and the second active layer ACT2 and between the first insulating layer INS1 and the buffer layer BF. The second gate insulating layer GI2 may be formed of an inorganic layer, for example, a silicon nitride layer, a silicon oxynitride layer, a silicon oxide layer, a titanium oxide layer, and/or an aluminum oxide layer.

The second gate electrode G2 and the first fingerprint capacitor electrode FCE1 of the second thin-film transistor ST2 may be disposed on the second gate insulating layer GI2. The second gate electrode G2 of the second thin-film transistor ST2 may overlap the second active layer ACT2 in the third direction (z-axis direction). For example, the second gate electrode G2 may overlap a channel area of the second active layer ACT2. The second gate electrode G2 of the second thin-film transistor ST2 and the first fingerprint capacitor electrode FCE1 may be made up of a single layer or multiple layers including at least one of molybdenum (Mo), aluminum (Al), chromium (Cr), gold (Au), titanium (Ti), nickel (Ni), neodymium (Nd) and copper (Cu) or an alloy thereof.

The first insulating layer INS1 may be disposed on the second gate electrode G2 of the second thin-film transistor ST2 and the first fingerprint capacitor electrode FCE1. The first insulating layer INS1 may be formed of an inorganic layer, for example, a silicon nitride layer, a silicon oxynitride layer, a silicon oxide layer, a titanium oxide layer, or an aluminum oxide layer. The first insulating layer INS1 may include a number of inorganic layers.

The light sensing element PD and the second fingerprint capacitor electrode FCE2 may be disposed on the first insulating layer INS1. The second fingerprint capacitor electrode FCE2 may overlap the first fingerprint capacitor electrode FCE1 in the third direction (z-axis direction). Since the first insulating layer INS1 has a predetermined dielectric constant, a capacitor may be formed by the first fingerprint capacitor electrode FCE1, the second fingerprint capacitor electrode FCE2, and the first insulating layer INS1 disposed therebetween.

The light sensing element PD may be implemented as, but is not limited to, a photo-diode as shown in FIG. 7. The light sensing element PD may be implemented as a phototransistor. The light sensing element PD may include a first sensing electrode PCE, a sensing semiconductor layer (e.g., a light-receiving semiconductor layer) PSE1, and a second sensing electrode PAE. For example, the first sensing electrode PCE may be a cathode electrode, and the second sensing electrode PAE may be an anode electrode.

The first sensing electrode PCE may be disposed on the first insulating layer INS1. The first sensing electrode PCE may be made of the same material as the second fingerprint capacitor electrode FCE2. The first sensing electrode PCE and the second fingerprint electrode PCE2 may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), art APC alloy or a stack structure of an APC alloy and ITO (ITO/APC/ITO).

The light-receiving semiconductor layer PSEM may be disposed on the first sensing electrode PCE. The light receiving semiconductor layer PSEM may have a PIN structure in which a p-type semiconductor layer PL, an i-type semiconductor layer IL, and an n-type semiconductor layer NL are stacked on cue another sequentially. When the light-receiving, semiconductor layer PSEM has the PIN structure, the i-type semiconductor layer IL is depleted by the p-type semiconductor layer PL and the n-type semiconductor layer NL so that an electric field is generated therein. The holes and electrons generated by sunlight are drifted by the electric field. Thus, the holes may be collected to the second sensing electrode PAE through the p-type semiconductor layer PL, while the electrons may be collected by the first sensing electrode PCE through the n-type semiconductor layer NL.

The p-type semiconductor layer PL may be disposed close to the surface on which the external light is incident, and the n-type semiconductor layer NL may be disposed distant from the surface on which the external light is incident. For example, compared to the n-type semiconductor layer NL, the p-type semiconductor layer PL may be closer to the collimator layer 420. Since the drift mobility of the holes is lower than the drift mobility of the electrons, it is desirable to form the p-type semiconductor layer PL closer to the surface on which the external light is incident to increase the collection efficiency of the incident light.

The n-type semiconductor layer NL may be disposed on the first sensing electrode PCE, and the i-type semiconductor layer IL may be disposed on the n-type semiconductor layer NL. In addition, the p-type semiconductor layer PL may be disposed on the i-type semiconductor layer IL. In such case, the p-type semiconductor layer PL may be formed by doping amorphous silicon (a-Si:H) with a p-type dopant. The i-type semiconductor layer IL may be made of amorphous silicon germanium (a-SiGe:H) or amorphous silicon carbide (a-SiC:H). The n-type semiconductor layer NL may be formed by doping amorphous silicon germanium (a-SiGe:H) or amorphous silicon carbide (a-SiC:H) with an n-type dopant. The p-type semiconductor layer PL and the n-type semiconductor layer NL may be formed to have a thickness of approximately 500 Å, and the i-type semiconductor layer IL may be formed to have a thickness of 5,000 to 10,000 Å.

In addition, the n-type semiconductor layer NL may be disposed on the first sensing electrode PCE, and the i-type semiconductor layer IL may be omitted. Further, the p-type semiconductor layer PL may be disposed on the n-type semiconductor layer NL. In such case, the p-type semiconductor layer PL may be formed by doping amorphous silicon (a-Si:H) with a p-type dopant. The n-type semiconductor layer NL may be formed by doping amorphous silicon germanium (a-SiGe:H) or amorphous silicon carbide (a-SiC:H) with art n-type dopant. The p-type semiconductor layer PL and the n-type semiconductor layer NL may be formed to having the thickness of about 500 Å.

In addition, the upper surface or lower surface of at least one of the first sensing electrode PCE, the p-type semiconductor layer PL, the i-type semiconductor layer IL, the n-type semiconductor layer NL and the second sensing electrode PAE may be formed to be uneven via a texturing process to increase the efficiency of absorbing external light. The texturing process is a process of forming a material surface into an uneven structure, like the surface of fabric. The texturing process may be carried out via an etching process using photolithography, an anisotropic etching using chemical solution, or a groove forming process using mechanical scribing.

The second sensing electrode PAE may be disposed on the p-type semiconductor layer PL. The second sensing electrode PAE may be made of a transparent conductive material (TCO) that can transmit light, such as ITO and IZO.

A second insulating layer INS2 may be disposed on the light sensing element PD and the second fingerprint capacitor electrode FCE2. The second insulating layer INS2 may be formed of an inorganic layer, for example, a silicon nitride layer, a silicon oxynitride layer, a silicon oxide layer, a titanium oxide layer, or an aluminum oxide layer. For example, the second insulating layer INS2 may include a number of inorganic layers.

A first connection electrode CE1, a second connection electrode CE2 and a third connection electrode CE3 may be disposed on the second insulating layer INS2.

The first connection electrode CE1 may be connected to the second source electrode S2 of the second thin-film transistor ST2 through a source contact hole SCT that penetrates through the first insulating layer INS1 and the second insulating layer INS2 to expose the second source electrode S2 of the second thin-film transistor ST2.

The second connection electrode CE2 may be connected to the second drain electrode D2 of the second thin-film transistor ST2 through a drain contact hole DCT that penetrates through the first insulating layer INS1 and the second insulating layer INS2 to expose the second drain electrode D2 of the second thin-film transistor ST2. The second connection electrode CE2 may be connected to the first sensing electrode PCE through a first sensing contact hole RCT1 that penetrates the second insulating layer INS2 to expose the first sensing electrode PCE. Accordingly, the drain electrode D2 of the second thin-film transistor ST2 and the first sensing electrode PCE of the light sensing element PD may be connected by the second connection electrode CE2.

The third connection electrode CE3 may be connected to the second sensing electrode PAE through a second sensing contact hole RCT2 that penetrates the second insulating layer INS2 to expose the second sensing electrode PAE.

The first connection electrode CE1, the second connection electrode CE2 and the third connection electrode CE3 may be made up of a single layer or multiple layers including at least one of molybdenum (Mo), aluminum (Al), chromium (Cr), gold (Au), titanium (Ti), nickel (Ni), neodymium (Nd) and copper (Cu) or an alloy thereof.

A third insulating layer INS3 may be disposed on the first connection electrode CE1, the second connection electrode CE2 and the third connection electrode CE3. The third insulating layer INS3 may be formed of an inorganic layer, for example, a silicon nitride layer, a silicon oxynitride layer, a silicon oxide layer, a titanium oxide layer, or an aluminum oxide layer. For example, the third insulating layer INS3 may include a number of inorganic layers. However, the present inventive concept is not limited thereto. For example, the third insulating layer INS3 may be omitted.

The planarization layer PLA may be disposed on the third insulating layer INS3. The planarization layer PLA may be formed of an organic layer such as an acryl resin, an epoxy resin, a phenolic resin, a polyamide resin and a polyimide resin.

The collimator layer 420 may include the light guide units LG and the second light-blocking unit LS2. The light guide units LG and the second light-blocking unit LS2 may be disposed on the planarization layer PLA of the light sensing layer 410.

The light guide units LG may be spaced apart from one another. The light guide units LG may be arranged in the first direction (x-axis direction) with a first predetermined spacing therebetween and may be arranged in the second direction (y-axis direction) with a second predetermined spacing therebetween. The first predetermined spacing may be, but is not limited to being, equal to the second predetermined spacing. For example, the light guide units LG may be arranged at approximately every 4 μm in the first direction (x-axis direction) and the second direction (y-axis direction). It is, however, to be understood that the present inventive concept is not limited thereto.

The light-transmitting unit LT may be disposed on side surfaces of the second light-blocking unit LS2. The outer surface LTO of the light-transmitting unit LT may be inclined at a first angle θ1 with respect to the upper surface of the planarization layer PLA of the light sensing layer 410. The inner surface LTI of the light-transmitting unit LT may be inclined at a second angle θ2 with respect to a virtual surface VS in parallel to the upper surface of the planarization layer PLA of the light sensing layer 410. The first angle θ1 may be, but is not limited to being, equal to the second angle θ2.

The light-transmitting unit LT may be formed of inorganic layers such as a silicon nitride layer, a silicon oxynitride layer, a silicon oxide layer, a titanium oxide layer, and an aluminum oxide layer. In addition, the light-transmitting unit LT may be formed of an organic layer such as an acryl resin, an epoxy resin, a phenolic resin, a polyamide resin and a polyimide resin.

The first light-blocking layer LS1 may be disposed on the light-transmitting unit LT. The first light-blocking layer LS1 may be made of a photosensitive resin that can block light. For example, the first light-blocking unit LS1 may include an inorganic black pigment such as carbon black or an organic black pigment. The refractive index of the first light-blocking layer LS1 may be lower than the refractive index of the light-transmitting unit LT. Accordingly, when an angle of incidence of light traveling in the light-transmitting unit LT toward the first light blocking unit LS1 is greater than the critical angle, the light may not travel into the first light-blocking unit LS1 but may be reflected at the inner surface LTI of the light-transmitting unit LT.

The second light-blocking layer LT2 may be disposed on the planarization layer PLA of the light sensing layer 410. The second light-blocking layer LT2 may be disposed between the light guide units LG in the first direction (x-axis direction). In addition, the second light-blocking layer LT2 may be disposed between the light guide units LG in the second direction (y-axis direction).

The second light-blocking layer LT1 may be made of a photosensitive resin that can block light. For example, the second light-blocking unit LS2 may include an inorganic black pigment such as carbon black or an organic black pigment. The refractive index of the second light-blocking layer LT2 may be lower than the refractive index of the light-transmitting unit LT. Accordingly, when an angle of incidence of light traveling in the light transmitting unit LT toward the second light-blocking unit LS2 is greater than the critical angle, the light may not travel into the second light-blocking unit LS2 but may be reflected at the outer surface LTO of the light-transmitting unit LT.

A transparent adhesive member 430 may be disposed on the collimator layer 420. For example, the transparent adhesive member 430 may be attached to the upper surface of the collimator layer 420 and the lower surface of the display panel 100.

Figure 8:
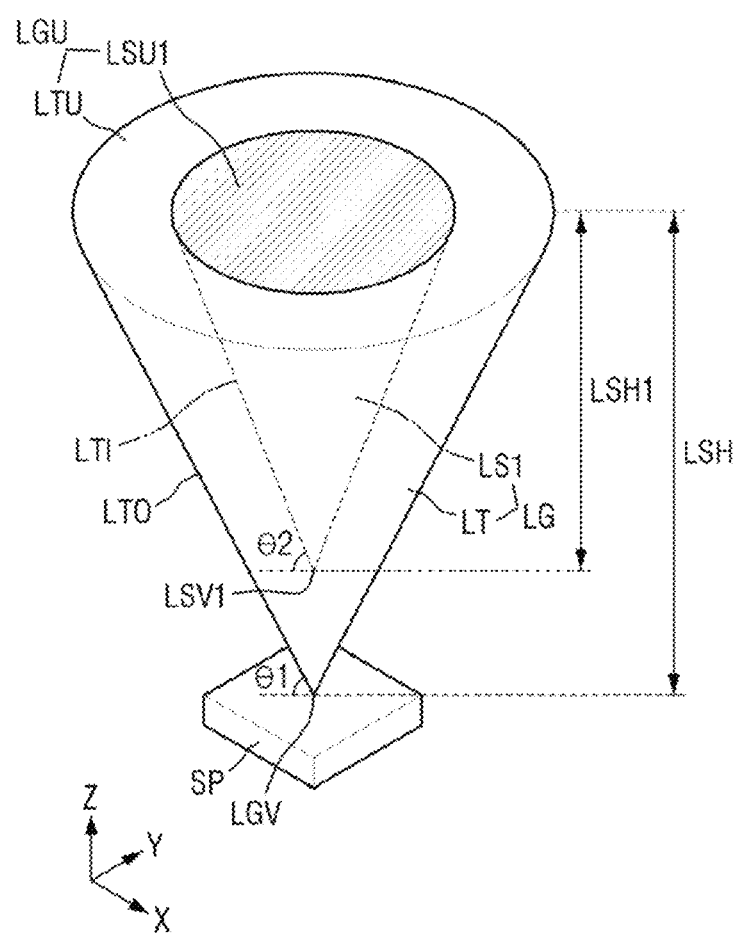
FIG. 8 is an enlarged view illustrating the sensor pixel and the light guide unit of FIG. 3 according to an exemplary embodiment of the present inventive concept.
Figure 9:
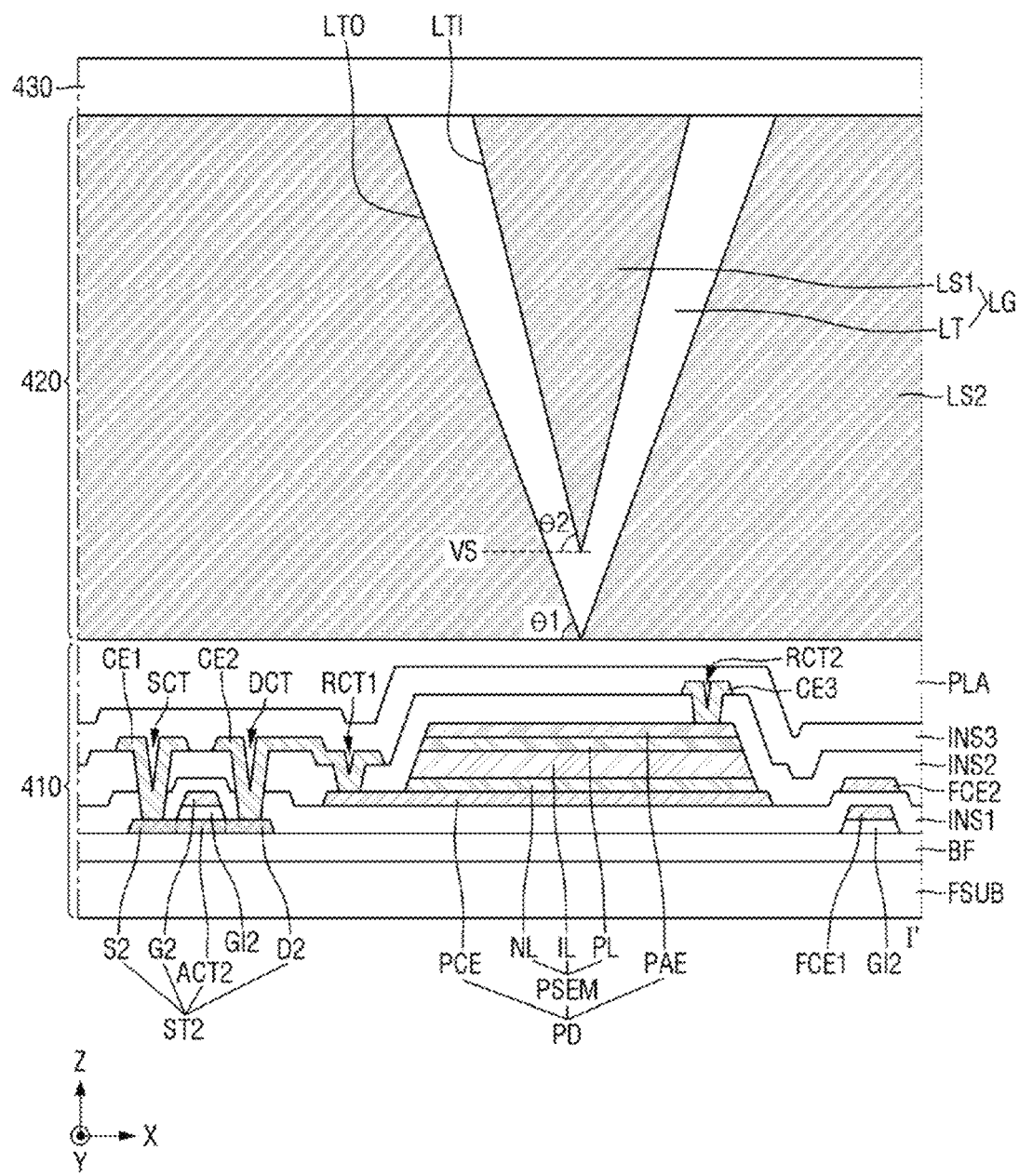
FIG. 9 is an enlarged cross-sectional view illustrating the fingerprint sensor of area A of FIG. 5 according to an exemplary embodiment of the present inventive concept.

FIG. 8 is an enlarged view illustrating the sensor pixel and the light guide unit of FIG. 1 according to an exemplary embodiment of the present inventive concept. FIG. 9 is an enlarged cross-sectional view illustrating the fingerprint sensor of area A of FIG. 5 according to an exemplary embodiment of the present inventive concept.

The exemplary embodiment of FIGS. 8 and 9 is different from the exemplary embodiment of FIGS. 4 and 7 in that a first angle θ1 is smaller than a second angle θ2. The following description will focus on the differences, and redundant descriptions may be omitted.

Referring to FIGS. 8 and 9, the light-transmitting unit LT may have an annular cross-sectional shape when it is cut in the first direction (x-axis direction) or the second direction (y-axis direction). The cross-sectional area of the light-transmitting unit LT may vary along the third direction (z-axis direction). For example, the cross-sectional area of the light-transmitting unit LT may decrease toward the sensor pixel SP.

The length of the light-transmitting unit LT in the first direction (x-axis direction) between the inner surface LTI and the outer surface LTO may vary along the third direction (z-axis direction). For example, the length of the light-transmitting unit LT in the first direction (x-axis direction) between the inner surface LTI and the outer surface LTO may decrease as the sensor pixel SP is approached.

If the fingerprint sensor 400 is disposed under the display panel 100, the light reflected off a finger F should pass through the display panel 100. Accordingly, a less amount of light is incident on the light sensing layer 410 of the fingerprint sensor 400 than what passes through the display panel 100. If the area of the light-blocking units LS1 and LS2 of the collimator layer 420 is reduced to increase the amount of light incident on the light sensing layer 410 of the fingerprint sensor 400, the noise light incident on the light sensing layer 410 may be increased. As a result, the accuracy of fingerprint recognition may be lowered.

As shown in FIGS. 8 and 9, when the width of the upper surface LTU of the light-transmitting unit LT is increased, the amount of light incident on the light-transmitting unit LT can be increased. Therefore, it is possible to increase the amount of light incident on the light sensing layer 410 without decreasing the areas of the light-blocking unit LS1 and LS2 of the collimator layer 420 and without lowering the accuracy of fingerprint recognition.

Figure 10:
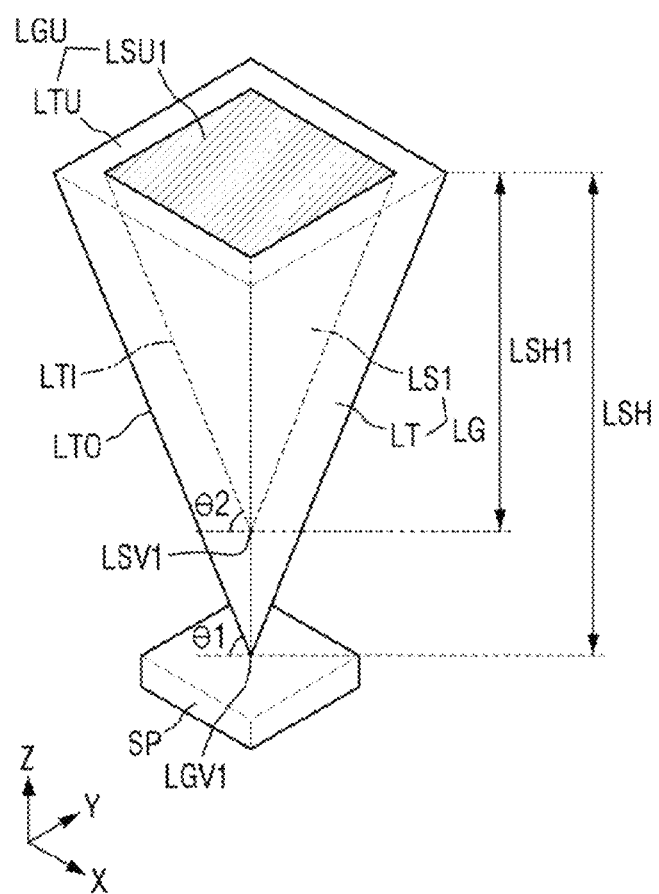
FIG. 10 is an enlarged view illustrating the sensor pixel and the light guide unit of FIG. 3 according to an exemplary embodiment of the present inventive concept.

FIG. 10 is an enlarged view illustrating the sensor pixel and the light guide unit of FIG. 3 according to an exemplary embodiment of the present inventive concept.

The exemplary embodiment of FIG. 10 is different from the exemplary embodiment of FIG. 4 in that a light guide unit LG is formed with a square pyramid shape rather than a cone shape. The following description will focus on the differences, and redundant descriptions may be omitted.

Referring to FIG. 10, the upper surface LGU of a light guide unit LG may be the base of a square pyramid, and the vertex LGV1 of the light guide unit LG may be the apex of the square pyramid. The upper surface LGU of the light guide unit LG may have a quadrangular shape when viewed from the top. For example, the upper surface LGU of the light guide unit LG may have a rectangular or square shape having two sides arranged in the first direction (x-axis direction) and two sides arranged in the second direction (y-axis direction) when viewed from the top. In addition, when the light guide unit LG is formed in a polypyramid other than a square pyramid, the upper surface LGU of the light guide unit LG may have a polygonal shape when viewed from the top.

The first light-blocking unit LS1 may have a square pyramid shape. The upper surface LSU1 of the first light-blocking unit LS1 may be the base of a square pyramid, and the vertex LSV1 of the first light-blocking unit LS1 may be the apex of the square pyramid. The upper surface LSU1 of the first light-blocking unit LS1 may have a quadrangular shape when viewed from the top. For example, the upper surface LSU1 of the first light-blocking unit LS1 may have a rectangular or square shape having two sides arranged in the first direction (x-axis direction) and two sides arranged in the second direction (y-axis direction) when viewed from the top. In addition, when the first light-blocking unit LS1 has a polypyramid shape other than a square pyramid, the upper surface LSU1 of the first light-blocking unit LS1 may have a polygonal shape when viewed from the top other than a square or rectangular shape.

The area of the upper surface LSU1 of the first light-blocking unit LS1 may be smaller than the area of the upper surface LGU of the light guide unit LG. The length of the upper surface LSU1 of the first light-blocking unit LS1 in the first direction (x-axis direction) may be smaller than the length of the upper surface LGU of the light guide unit LG in the first direction (x-axis direction). The width of the upper surface LSU1 of the first light-blocking unit LS1 in the second direction (y-axis direction) may be smaller than the width of the upper surface LGU of the light guide unit LG in the second direction (y-axis direction). The height LSH1 of the first light-blocking unit LS1 may be smaller than the height LGH of the light guide unit LG. Therefore, the size of the first light-blocking unit LS1 (e.g., the surface area or volume) may be smaller than the size of the light guide unit LG.

For example, the first light-blocking unit LS1 may have a quadrangular cross-sectional shape when it is cut in the first direction (x-axis direction) or the second direction (y-axis direction). Since the first light-blocking unit LS1 has a square pyramid shape, the cross-sectional area of the first light-blocking unit LS1 may vary along the third direction (z-axis direction). For example, the cross-sectional area of the first light-blocking unit LS1 may be reduced toward the sensor pixel SP.

The upper surface LTU of the light-transmitting unit LT may have an annular shape when viewed from the top. For example, the light-transmitting unit LT may have a cross-sectional shape like a square frame (e.g., a polygonal shape with an opening) when it is cut in the first direction (x-axis direction) or the second direction (y-axis direction).

Figure 11:
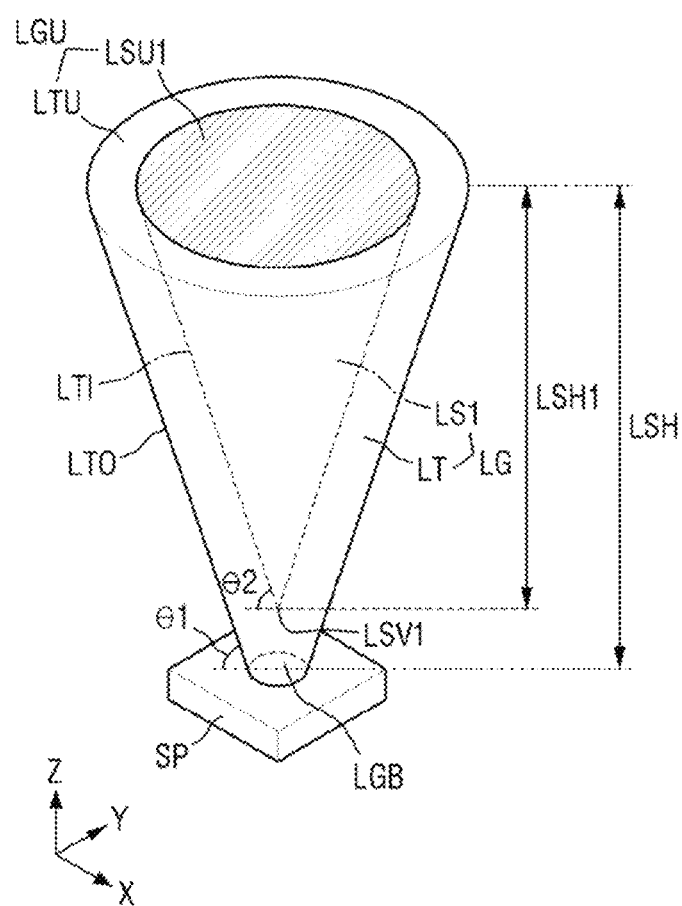
FIG. 11 is an enlarged view illustrating the sensor pixel and the light guide unit of FIG. 3 according to an exemplary embodiment of the present inventive concept.

FIG. 11 is an enlarged view illustrating the sensor pixel and the light guide unit of FIG. 3 according to an exemplary embodiment of the present inventive concept.

The exemplary embodiment of FIG. 11 is different from the exemplary embodiment of FIG. 4 in that a light guide unit LG is formed with a truncated cone shape rather than a cone shape. The following description will focus on the differences, and redundant descriptions may be omitted.

Referring to FIG. 11, the upper surface LGU of a light guide unit LG may be a first base of a truncated cone, and the lower surface LGB of the light guide unit LG may be a second base of the truncated cone. The upper surface LGU and the lower surface LGB of the light guide unit LG may be parallel to each other. Each of the upper surface LGU and the lower surface LGB of the light guide unit LG may have, but is not limited to, a circular shape when viewed from the top. For example, when the light guide unit LG has a truncated elliptical cone shape, each of the upper surface LGU and the lower surface LGB of the light guide unit LG may have an elliptical shape when viewed from the top. In addition, when the light guide unit LG has a truncated polypyramid shape, each of the upper surface LGU and lower surface LGB of the light guide unit LG may have a polygonal shape when viewed from the top. The area of the upper surface LGU of the light guide unit LG may be larger than the area of the lower surface LGB. The diameter of the upper surface LGU of the light guide unit LG may be larger than the diameter of the lower surface LGB.

The first light-blocking unit LS1 may have a cone shape. The upper surface LSU1 of the first light-blocking unit LS1 may be the base of a cone, and the vertex LSV1 of the first light-blocking unit LS1 may be the apex of the cone. The upper surface LSU1 of the first light-blocking unit LS1 may have, but is not limited to, a circular shape when viewed from the top. For example, when the first light-blocking unit LS1 has an elliptical cone shape, the upper surface LSU1 of the first light-blocking unit LS1 may have an elliptical shape when viewed from the top. In addition, when the first light-blocking unit LS1 has a polypyramid shape, the upper surface LSU1 of the first light-blocking unit LS1 may have a polygonal shape.

The area of the upper surface LSU1 of the first light-blocking unit LS1 may be smaller than the area of the upper surface LGU of the light guide unit LG. The diameter of the upper surface LSU1 of the first light-blocking unit LS1 may be smaller than the diameter of the upper surface LGU of the light guide unit LG.

The height LSH1 of the first light-blocking unit LS1 may be smaller than the height LGH of the light guide unit LG. It is, however, to be understood that the present inventive concept is not limited thereto. The height LSH1 of the first light-blocking unit LS1 may be substantially identical to the height LGH of the light guide unit LG. In such case, the vertex LSV1 of the first light-blocking unit LS1 may be in contact with the lower surface LGB of the light guide unit LG.

As shown in FIG. 11, when the light guide unit LG includes the lower surface LGB, the area of the light guide unit LG in contact with the sensor pixel SP is increased, and thus the amount of light incident on the sensor pixel SP can be increased. Therefore, it is possible to increase the amount of light incident on the light sensing layer 410 without decreasing the areas of the light-blocking unit LS1 and LS2 of the collimator layer 420 and without lowering the accuracy of fingerprint recognition.

Figure 12:
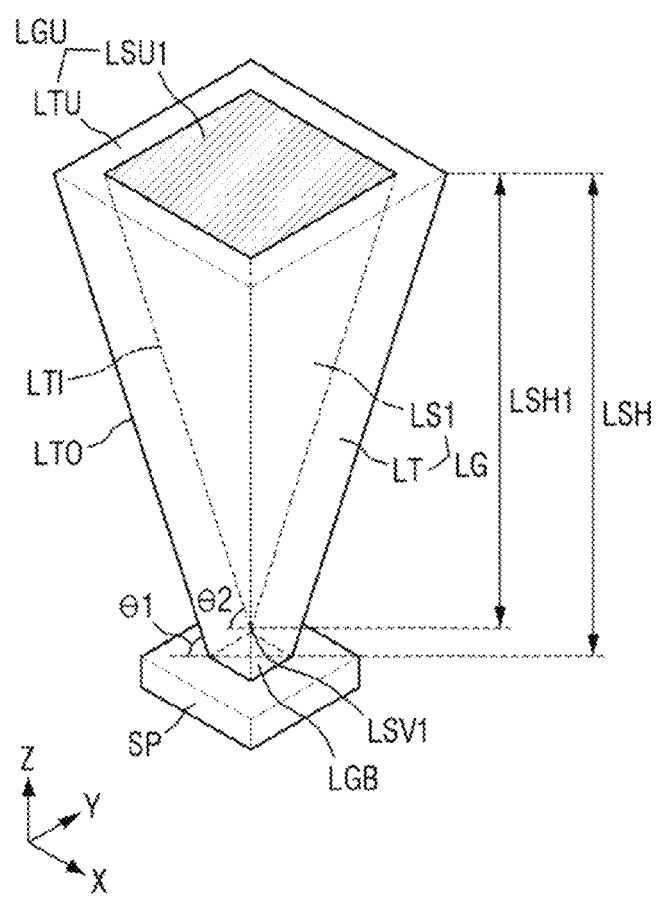
FIG. 12 is an enlarged view illustrating the sensor pixel and the light guide unit of FIG. 3 according to an exemplary embodiment of the present inventive concept.

FIG. 12 is an enlarged view illustrating the sensor pixel and the light guide unit of FIG. 3 according to an exemplary embodiment of the present inventive concept.

The exemplary embodiment of FIG. 12 is different from the exemplary embodiment of FIG. 4 in that a light guide unit LG is formed with a truncated square pyramid shape rather than a cone shape. The following description will focus on the differences, and redundant descriptions may be omitted.

Referring to FIG. 12, the upper surface LGU of a light guide unit LG may be a first base of a truncated square pyramid shape, and the lower surface LGB of the light guide unit LG may be a second base of the truncated square pyramid shape. The upper surface LGU and the lower surface LGB of the light guide unit LG may be parallel to each other. Each of the upper surface LGU and the lower surface LGB of the light guide unit LG may have a quadrangular shape when viewed from the top. For example, each of the upper surface LGU and the lower surface LGB of the light guide unit LG may have a rectangular or square shape having two sides arranged in the first direction (x-axis direction) and two sides arranged in the second direction (y-axis direction) when viewed from the top. In addition, when the light guide unit LG has a truncated polypyramid shape other than a square pyramid, each of the upper surface LGU and lower surface LGB of the light guide unit LG may have a polygonal shape when viewed from the top.

The area of the upper surface LGU of the light guide unit LG may be larger than the area of the lower surface LGB. The length of the upper surface LGU of the light guide unit LG in the first direction (x-axis direction) may be smaller than the length of the lower surface LGB in the first direction (x-axis direction). The width of the upper surface LGU of the light guide unit LG in the second direction (y-axis direction) may be smaller than the width of the lower surface LGB in the second direction (y-axis direction).

The first light-blocking unit LS1 may have a square pyramid shape. The upper surface LSU1 of the first light-blocking unit LS1 may be the base of a square pyramid, and the vertex LSV1 of the first light-blocking unit LS1 may be the apex of the square pyramid. The upper surface LSU1 of the first light-blocking unit LS1 may have a quadrangular shape when viewed from the top. For example, the upper surface LSU1 of the first light-blocking unit LS1 may have a rectangular or square shape having two sides arranged in the first direction (x-axis direction) and two sides arranged in the second direction (y-axis direction) when viewed from the top. In addition, when the first light-blocking unit LS1 has a polypyramid shape other than a square pyramid, the upper surface LSU1 of the first light-blocking unit LS1 may have a polygonal shape, other than a square or rectangular shape, when viewed from the top.

The area of the upper surface LSU1 of the first light-blocking unit LS1 may be smaller than the area of the upper surface LGU of the light guide unit LG. The length of the upper surface LSU1 of the first light-blocking unit LS1 in the first direction (x-axis direction) may be smaller than the length of the upper surface LGU of the light guide unit LG in the first direction (x-axis direction). The width of the tipper surface LSU1 of the first light-blocking unit LS1 in the second direction (y-axis direction) may be smaller than the width of the upper surface LGU of the light guide unit LG in the second direction (y-axis direction).

The height LSH1 of the first light-blocking unit LS1 may be smaller than the height LGH of the light guide unit LG. It is, however, to be understood that the present inventive concept is not limited thereto. The height LSH1 of the first light-blocking unit LS1 may be substantially identical to the height LGH of the light guide unit LG. In such case, the vertex LSV1 of the first light-blocking unit LS1 may be in contact with the lower surface LGB of the light guide unit LG.

As shown in FIG. 12, when the light guide unit LG includes the lower surface LGB, the area of the light guide unit LG in contact with the sensor pixel SP is increased, and thus the amount of light incident on the sensor pixel SP can be increased. Therefore, it is possible to increase the amount of light incident on the light sensing layer 410 without decreasing the areas of the light-blocking unit LS1 and LS2 of the collimator layer 420 and without lowering the accuracy of fingerprint recognition.

While the present inventive concept has been described with reference to the exemplary embodiments thereof, it will be understood by those of ordinary skill in the art that various changes in form and detail may be made thereto without departing from the spirit and scope of the present inventive concept.

What is claimed is:

1. A fingerprint sensor comprising:
   a light sensing layer comprising a light sensing element, wherein a sensing current flows in the light sensing element according to incident light; and
   a collimator layer disposed on the light sensing layer and comprising a light guide unit guiding light to the light sensing element,
   wherein the light guide unit comprises:

a light-transmitting unit configured to provide light to the light sensing element; and a first light-blocking unit disposed on an inner surface of the light-transmitting unit, wherein a height of the first light-blocking unit is different from a height of the light-transmitting unit, wherein a distance between a first outer surface of the light-transmitting unit and the inner surface of the light transmitting unit decreases as the light sensing layer is approached, wherein a lowermost portion of the first light-blocking unit overlaps a lowermost portion of the light-transmitting unit in a thickness direction of the first light-blocking unit, wherein the lowermost portion of the first light-blocking unit is spaced apart from the lowermost portion of the light-transmitting unit in the thickness direction, wherein the lowermost portion of the first light-blocking unit is a first vertex formed by a first side surface of the first light-blocking unit and a second side surface of the first-light blocking unit, and the lowermost portion of the light-transmitting unit is a second vertex formed by the first outer surface and a second outer surface of the light-transmitting unit.

2. The fingerprint sensor of claim 1, wherein the collimator layer further comprises a second light-blocking unit surrounding the first and second outer surface of the light-transmitting unit.

3. The fingerprint sensor of claim 2, wherein a refractive index of the first light-blocking unit is smaller than a refractive index of the light-transmitting unit, and a refractive index of the second light-blocking unit is smaller than the refractive index of the light-transmitting unit.

4. The fingerprint sensor of claim 2, wherein the inner surface of the light-transmitting unit is inclined at a first angle with respect to an upper surface of the light sensing layer, wherein the first and second outer surface of the light-transmitting unit are inclined at a second angle with respect to the upper surface of the light sensing layer, wherein first angle is different from the second angle.

5. The fingerprint sensor of claim 1, wherein each of the light guide unit and the first light-blocking unit has a cone shape.

6. The fingerprint sensor of claim 5, wherein an upper surface of the light-transmitting unit has an annular shape from a plan view, and wherein an upper surface of the first light-blocking unit has a circular shape from a plan view.

7. The fingerprint sensor of claim 5, wherein $a^2/\lambda = -Z \ll 1$ is satisfied, wherein "a" denotes a diameter of an upper surface of the light guide unit, "z" denotes a height of the light guide unit, and "λ" denotes a wavelength of light incident on the light-transmitting unit.

8. The fingerprint sensor of claim 5, wherein a width of the light-transmitting unit ranges from about 0.8 μm to about 2 μm.

9. The fingerprint sensor of claim 1, wherein an area of an upper surface of the light guide unit is larger than an area of an upper surface of the first light-blocking unit.

10. The fingerprint sensor of claim 1, wherein a cross-sectional area of the first light-blocking unit decreases toward the light sensing layer.

11. The fingerprint sensor of claim 1, wherein an area of an upper surface of the light guide unit is larger than an area of a lower surface of the light guide unit.

12. The fingerprint sensor of claim 1, wherein each of the light guide unit and the first light-blocking unit has a polypyramid shape.

13. The fingerprint sensor of claim 12, wherein the light-transmitting unit has a polygonal shape with an opening from a plan view, and wherein the first light-blocking unit has a polygonal shape from a plan view.

14. A display device comprising:
a display panel configured to display an image; and
a fingerprint sensor disposed on a surface of the display panel and configured to sense light passing through the display panel,
wherein the fingerprint sensor comprises:
a light sensing layer comprising a light sensing element, wherein a sensing current flows in the light sensing element according to received light; and
a collimator layer disposed on the light sensing layer and comprising a light guide unit guiding light to the light sensing element, and
wherein the light guide unit comprises:
a light-transmitting unit configured to provide light to the light sensing element; and
a first light-blocking unit disposed on an inner surface of the light-transmitting unit,
wherein a height of the first light-blocking unit is different from a height of the light-transmitting unit,
wherein a distance between a first outer surface of the light-transmitting unit and the inner surface of the light transmitting unit decreases as the light sensing layer is approached,
wherein a lowermost portion of the first light-blocking unit overlaps a lowermost portion of the light-transmitting unit in a thickness direction of the first light-blocking unit, wherein the lowermost portion of the first light-blocking unit is spaced apart from the lowermost portion of the light-transmitting unit in the thickness direction,
wherein the lowermost portion of the first light-blocking unit is a first vertex formed by a first side surface of the first light-blocking unit and a second side surface of the first-light blocking unit, and the lowermost portion of the light-transmitting unit is a second vertex formed by the first outer surface and a second outer surface of the light-transmitting unit.

15. The display device of claim 14, wherein the collimator layer further comprises a second light-blocking unit disposed on the first and second outer surface of the light-transmitting unit.

16. The display device of claim 15, wherein a refractive index of the first light-blocking unit is smaller than a refractive index of the light-transmitting unit, and a refractive index of the second light-blocking unit is smaller than the refractive index of the light-transmitting unit.

17. The display device of claim 14, wherein an area of an upper surface of the light guide unit is larger than an area of an upper surface of the first light-blocking unit.

18. The display device of claim 14, wherein a cross-sectional area of the first light-blocking unit decreases toward the light sensing layer.

* * * * *